(12) United States Patent
Weiss et al.

(10) Patent No.: US 8,004,678 B2
(45) Date of Patent: Aug. 23, 2011

(54) WAFER LEVEL ALIGNMENT STRUCTURES USING SUBWAVELENGTH GRATING POLARIZERS

(75) Inventors: Martin Weiss, Portland, OR (US); Brian Kinnear, Hillsboro, OR (US); Telly Koffas, Beaverton, OR (US); David Fryer, Hillsboro, OR (US); Ming-chuan Yang, Meridian, ID (US); William T Blanton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 210 days.

(21) Appl. No.: 11/823,107

(22) Filed: Jun. 26, 2007

(65) Prior Publication Data

US 2009/0002706 A1    Jan. 1, 2009

(51) Int. Cl.
*G01B 11/00* (2006.01)
*G01J 4/00* (2006.01)
(52) U.S. Cl. ........................................ 356/399; 356/369
(58) Field of Classification Search .................. 356/369, 356/399–401, 614, 620; 382/151; 430/5, 430/22, 30; 355/53, 55, 77; 257/797; 438/797
See application file for complete search history.

(56) References Cited

U.S. PATENT DOCUMENTS

| 2004/0169861 | A1* | 9/2004 | Mieher et al. ................. 356/400 |
| 2005/0286052 | A1* | 12/2005 | Huggins et al. ................ 356/401 |
| 2006/0044568 | A1 | 3/2006 | Weiss |

OTHER PUBLICATIONS

Flanders, Dale C., "Submicrometer periodicity gratings as artificial anisotropic dielectrics", *Applied Physics Letters* 42 (6), (Mar. 15, 1983), pp. 492-494.
Zeitner, U.D. et al., "Diffractive Optical Elements with Polarization-Multiplexing", *SPIE* vol. 3099, pp. 189-194.

* cited by examiner

*Primary Examiner* — Tarifur Chowdhury
*Assistant Examiner* — Tara S Pajoohi
(74) *Attorney, Agent, or Firm* — Caven & Aghevli LLC

(57) ABSTRACT

In one embodiment, a wafer alignment system, comprises a radiation source to generate radiation, a radiation directing assembly to direct at least a portion of the radiation onto a surface of a wafer, the radiation having a polarization state, an optical analyzer to collect at least a portion of the radiation reflected from the wafer, the wafer including at least a first region having a first grating pattern oriented in a first direction and at least a second region having a second grating pattern oriented in a second direction, different from the first direction.

14 Claims, 3 Drawing Sheets

WAFER LEVEL ALIGNMENT STRUCTURES USING SUBWAVELENGTH GRATING POLARIZERS

BACKGROUND

The subject matter described herein relates generally to semiconductor processing, and more particularly to wafer level alignment structures using subwavelength grating polarizers.

During semiconductor device fabrication processing numerous (e.g., hundreds of) integrated circuit chips or die, each having millions of electronic devices, may be formed on a single semiconductor wafer. The wafer may be a thin disk or round slice of semiconductor material (e.g., silicon), such as to provide a semiconductor (e.g., silicon, germanium, or a combination thereof) or semiconductor on insulator (SOI) substrate on or in which to form the electronic devices.

Similarly, targets (e.g., wafer alignment optical targets) may be formed on or in layers of the wafer to accurately align the wafers for processing to form the devices (and to form the targets). A large number of semiconductor device fabrication processing tools perform some level of basic alignment on semiconductor wafers prior to processing them. Alignment may be used to determine a radial, rotational, two dimensional, three dimensional and/or a coordinate system based position or location on the wafer. The fabrication process may include a device fabrication process to form circuit features or structures of electronic devices (e.g., to form gate structures, diffusion regions, sources, drains, dielectric layers, gate spacers, shallow trench isolation (STI), integrated circuits, conductive interconnects, metal or alloy features, metal or alloy traces, metal or alloy contacts, and the like of transistors, resistors, capacitors and the like). The device fabrication process may include forming layers of circuitry or circuit features in or on layers of the wafer. The fabrication process may end with a dicing process to separate or "saw" the wafer into distinct chips or die. To accurately align the wafer to form the electronic device circuitry at proper locations (e.g., regions or portions of the wafer surface and/or layers below the surface), a wafer scanning (e.g., a wafer inspection or alignment) process may be used during the device fabrication process, and/or dicing process. The inspection or alignment process typically includes locating one or more optical pattern recognition targets to index the wafer.

Wafer alignment is typically accomplished by using pattern recognition software to locate specific targets, structures, or features on wafers and then correcting for wafer position relative to the tool's wafer stage. Examples of such equipment include scanner, critical dimension scanning electron microscopy (CDSEM), litho registration, defect inspection, and film thickness tools. In general, the alignment systems used on these tools are based on optical microscopes (e.g., alignment or inspection microscopes). In order for the pattern recognition to be successful, the target structures need to have sufficiently high optical contrast relative to their surrounding background. In some process technologies, targets are created by lithographically patterning large, isolated solid features (few tens of microns in size) on wafers. These pattern recognition targets are constructed from large patterns arranged in some unique shape. For some fabrication process technologies, the large patterns may have defect issues due to line-width and/or critical dimension (CD) control requirements. For example, in some fabrication process technologies, linewidth and CD control requirements dictate very tight control of solid feature size and pattern density in order to enable the patterning process and avoid defect issues. For example, use of large, non-design rule-compliant solid features in some fabrication technologies would result in polish (e.g., chemical mechanical polishing (CMP) to planarize a surface of the wafer) dishing, film delamination, and/or defect generation, depending on the layer. These structures tend to be incompatible with such rules given that they need to be fairly large in order to be observable under an alignment microscope.

BRIEF DESCRIPTION OF THE DRAWINGS

The disclosed embodiments will be better understood from a reading of the following detailed description, taken in conjunction with the accompanying figures in the drawings in which.

DETAILED DESCRIPTION

Figure 1:
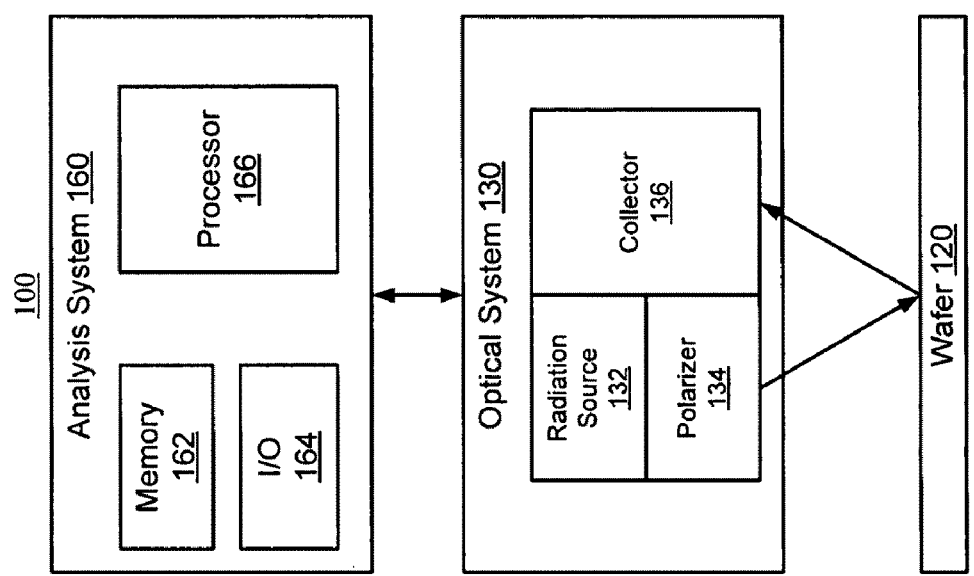
FIG. 1 is a schematic illustration of a wafer of alignment system, according to embodiments.

FIG. 1 is a schematic illustration of a wafer of alignment system 100, according to embodiments. Referring to FIG. 1, in an embodiment a system 100 comprises an optical system 130 and an analysis system 160. The optical system 130 comprises a radiation source 132, a polarizer 134, and a collector 136. In some embodiments, radiation source 132 emits radiation having a wavelength that measures between 350 nanometers (nm) and 800 nm. In alternate embodiments radiation source 132 may generate incoherent light.

Radiation emitted from radiation source 132 is transmitted to polarizer 134, which polarizes radiation from radiation source 132 into either a linear polarization or an elliptical polarization state. In some embodiments polarizer 134 may be implemented as a polarizing beam splitter, such as a Wollaston prism. In other embodiments, polarizer 134 may be implemented as a thin film polarizer, a birefringent polarizer, or the like. Optical system 130 may include additional optical components such as, e.g., lenses, filters, mirrors, collimators, or the like. Radiation source 132, polarizer 134, and any additional optical components associated with directing radiation toward wafer 120 may be considered a radiation directing assembly.

At least a portion of the radiation reflected from the surface of wafer 120 is collected by collector 136. In some embodiments, collector 136 may be implemented as an optical microscope.

The analysis system 160 comprises a memory module 162, an input/output module 164 and a processor 166 and may be integrated within system 100 or may be a stand-alone computer system coupled to the system 100.

Figure 2A:
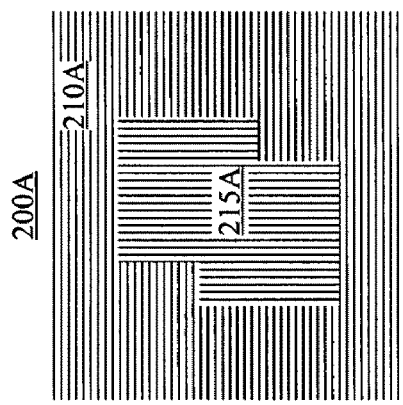
FIGS. 2A and 2B are schematic top perspective view of examples of pattern recognition targets in regions of a wafer that may be used for wafer alignment.
Figure 2B:
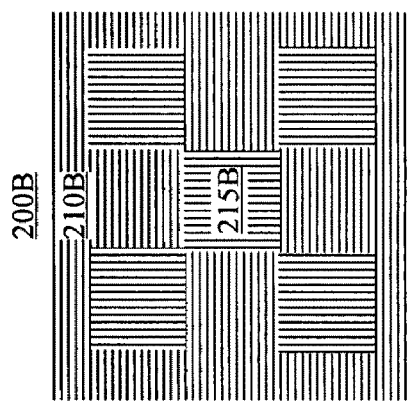

FIGS. 2A and 2B are schematic top perspective view of examples of pattern recognition targets 210A, 210B in regions of a wafer that may be used for wafer alignment. Pattern recognition targets 210A, 210B may be collectively referred to herein by reference 210. The targets 210 may be constructed from large patterns or structures of segmented (i.e. grating) features arranged in some unique shape on or in wafer 120 (e.g., on a surface or topmost surface of wafer 120). The targets 210 include at least a first region 210 having a first grating pattern oriented in a first direction and at least a second region 215 having a second grating pattern oriented in a second direction, different from the first direction. Space in the embodiment depicted in FIGS. 2A and FIG. 2B, the first direction and the second direction are substantially perpendicular to one another.

For example, FIG. 2A shows target 200A as a large structure having a first region 210A having a plurality of grating lines oriented in a horizontal position, and a second region 215A having a plurality of grating lines oriented in a substantially vertical position. Similarly, FIG. 2B shows target 200B as a large structure having a first region 210B having a plurality of grating lines oriented in a horizontal position, and a second region 215B having a plurality of grating lines oriented in a substantially vertical position. Second region 215B forms a checkerboard pattern within first region 210B.

Each region 210, 215 may be larger than the minimum resolution size (e.g., are greater than a best resolution limit possible) of a wafer alignment system inspection microscope (e.g., each of those features may be larger than a minimum size pixel the optical inspection microscope can focus on, thus the microscope can "see", focus on, or identify those features and their location). In some cases, each region 210, 215 may be larger or equal to a 100 microns squared ($\mu m^2$) area. Thus, the microscope is able to clearly see, form an image of, or identify each features shape and edges.

According to embodiments, pattern recognition targets including one or more regions 210, 215 of gratings (e.g., instead of a flat surface of a single material, a region of grating has grating features such as grates of a single material, another different material between the grates, and/or spaces between the grates) can be used with or instead of targets having only single material solid features. In some embodiments, regions 210 may be distinguished from regions 215 by illuminating the surface of the wafer 120 with polarized light and distinguishing between reflection patterns generated by regions 210 and 215, respectively.

When light shines onto a reflective grating surface, as shown in FIGS. 2A and 2B, light reflects off of the grating at discrete angles defined by $$\theta_n = \sin^{-1}(n\lambda/\Lambda - \sin\theta_i) \quad (1)$$

where $\theta_i$ is the incident angle, $\Lambda$ is the pitch of the grating, $\lambda$ is the wavelength of the light, n=0 is referred to as the zeroth order or reflected light, while n=±1, ±2, ... is referred to as the diffracted orders. When the grating pitch is sufficiently smaller than the wavelength ($\Lambda < \sim 350$ nm for visible light), then little if any of the incident light is diffracted. In this regime, the zeroth order/reflected light accounts for nearly all of the light leaving the grating.

The grating may be modeled using effective media theory as a uniform media with different refractive indices for light polarized parallel vs. perpendicular to the grating grooves. The "effective media" exhibits the following refractive indices for the parallel and perpendicular polarizations:

$$n_{parallel} = [n_1^2 q + n_2^2(1-q)]^{1/2} \quad (2)$$

$$n_{perpendicular} = [(q/n_1^2) + (1-q)/n_2^2]^{-1/2} \quad (3)$$

where q is the duty cycle of the grating. As a result, light reflecting off of the grating experiences a polarization-dependent phase shift. Using (2) and (3), the reflectivity (i.e. ratio of reflected light to incident light) of the grating for each polarization may be expressed in the form $$R_{parallel} = A + B^* \cos(4\pi n_{parallel} d/\lambda) \quad (4)$$

$$R_{perpendicular} = A + B^* \cos(4\pi n_{perpendicular} d/\lambda) \quad (5)$$

where A and B are constants (=function of n1, n2, n3), and d is the height of the grating grooves.

From equations (4) and (5), it is apparent that the reflectivity varies sinusoidally with refractive index and that furthermore, since each polarization has a different refractive index, the reflectivity of each polarization is different. By choosing the grating parameters properly (n1, n2, n3, $\lambda$, q, $\Lambda$), reflectivity can be increased (or maximized) for one of the incident polarizations (i.e. $4\pi n_{parallel} d/\pi$=even multiple of $\pi$, while minimizing it for the other (i.e. $4\pi n_{perpendicular} d/\pi$=odd multiple of $\pi$. In this manner, the grating structure behaves as an optical polarizer.

Figure 3:
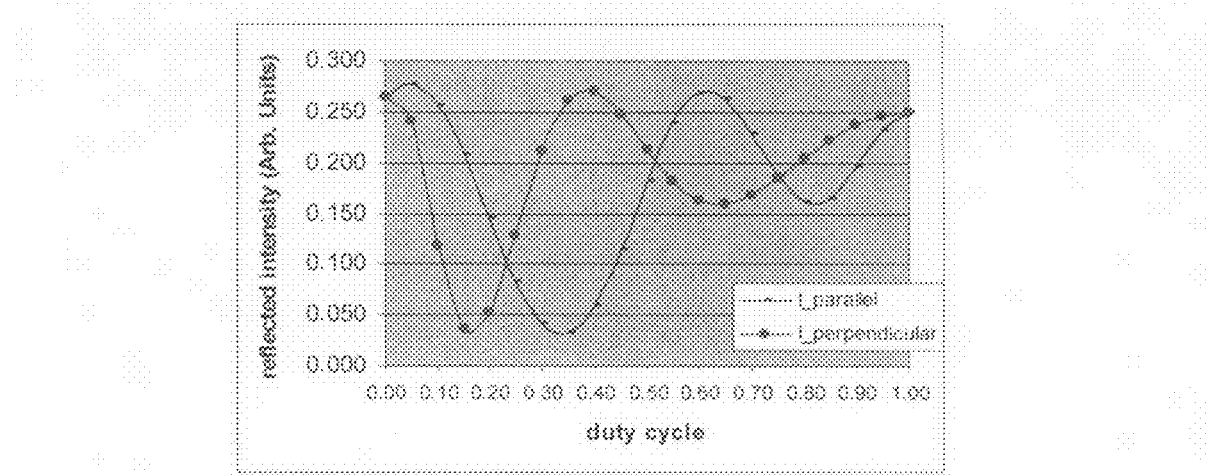
FIG. 3 is a schematic illustration of a plot of reflectivity as a function of grating pitch for each polarization of reflected radiation.

FIG. 3 is a schematic illustration of a plot of reflectivity as a function of grating pitch for each polarization of reflected radiation. In this example, for q=0.35, the reflectivities for the parallel and perpendicular polarizations are 5.9% and 32.9%, respectively. The effective media approach presented here is only an approximation. A rigorous analysis of the polarization of the reflected light is considerably more complicated. Nevertheless, it serves to illustrate how a grating can function as a polarizer.

Consequently, wafer alignment may be accomplished by using pattern recognition software to locate (e.g., to "see", focus on, find, and/or identify) specific targets or target features having gratings in or on wafers and then correcting for wafer position relative to the tool's wafer stage. Such targets, features, and or gratings may be described as in, on, of, or for a wafer. For instance, a wafer processing tool (e.g., a semiconductor device fabrication processing tool) may include a wafer alignment system having an inspection microscope to inspect a wafer "surface" (e.g., the topmost surface as well as and/or layers below the topmost surface) by radiating or exposing the surface to light (e.g., incident light through a numerical aperture of the system or microscope and onto the surface) and collecting, receiving and/or measuring the light reflected and diffracted back to the system or microscope (e.g., back through or within the numerical aperture). The light may be white light, have a specific wavelength spectrum or color, and/or including or have a "centroid wavelength". The targets and/or features may be identified and/or located by the brightness, darkness and/or contrast between brightness and darkness of light reflected back from regions of or areas of one or more layers of gratings. The alignment system may align the tool with a wafer, and/or a portion, region, and/or field of the wafer sufficiently for the tool to be able to accurately and successfully perform device fabrication processes at the portion, region, and/or field of the wafer.

Also, the appearance of the alignment targets described herein may be controlled primarily by the pitch and positioning of the two gratings relative to each other. Although the individual grating features (e.g., dimensions) forming the gratings may be below the resolution limit of the alignment microscopes, contrast may be achieved by controlling the diffractive and polarizing properties of the grating. In other words, a region of grating may be detectable by an inspection microscope, even though the grates, material and/or space between the grates (e.g., grates or features of a grating) of the grating have physical dimensions (e.g., width) that are smaller or below the minimum resolution size of an inspection microscope (e.g., smaller than the minimum size pixel, solid feature, or grating feature the microscope can form an image of, such as on a screen). The detection may be possible because the region has a uniform or consistent "dark", "bright" or "gray" brightness detected by the microscope as compared to adjacent regions, which may have a different brightness and/or which may define an edge between the regions.

Thus, according to embodiments alignment structures may be designed to take advantage of the polarizing nature of reflection gratings to create optical contrast on the surface of the wafer. Reflection gratings may be designed with different reflectivities for different polarization orientations and patterned onto wafers using conventional lithography. For example, alignment gratings may be included in the scribelines of production reticles and be patterned onto wafers during the various lithography operations in the process flow. In some embodiments, two regions of gratings may be formed on a wafer: a "feature region" and a "background region". The gratings forming the feature and background regions may be arranged such that the lines forming the gratings in each region are rotated by 90 degrees to each other, as shown in FIGS. 2A and 2B. In this example, the lines forming the feature region are vertical, while the lines forming the background region are horizontal. When illuminated by linearly polarized light, with the electric field vector oriented parallel or nearly parallel to one set of lines, one of the regions would appear "bright" (i.e. very reflective) while the other region would appear "dark" (i.e. less reflective).

In some embodiments, the background and feature regions can be patterned onto a wafer in a single reticle exposure, allowing the grating alignment structure to be used at subsequent processing steps. If needed (for example to meet pattern density design rules at multiple process layers), the same pattern can be replicated at multiple lithography operations. Additionally, the grating patterns created at different lithography layers may be stacked on top of each other to enhance the polarization effect.

Figure 4A:
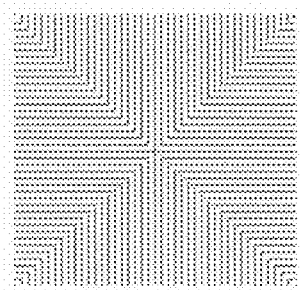
FIGS. 4A-4C are schematic illustrations of wafer-level alignment structures according to embodiments.
Figure 4B:
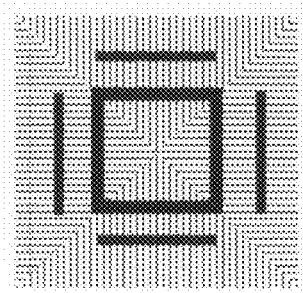
Figure 4C:
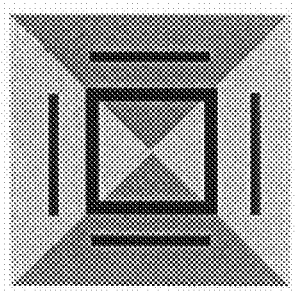

FIGS. 4A-4C are a schematic illustrations of wafer-level alignment structures according to embodiments. Referring to FIG. 4A, the litho registration metrology structures may be designed using a variety of dummification strategies. The dummification pattern consists of nested lines and spaces, which may be drawn on the reticle. The top and bottom quadrants of the dummification consist of pattern vertical lines. The left and right quadrants consist of horizontal lines. The dummification is intended to satisfy pattern density design rules without interfering with registration measurement. For example, the dummification pattern shown in FIG. 4A may be lithographically patterned on a wafer. This pattern consists of nested lines and spaces, oriented either horizontally or vertically, with a pitch of 320 nm. Registration measurement features may be patterned on top of the dummification pattern at subsequent lithography steps, forming the structure shown in FIG. 4B. When the dummification pattern on a actual wafer is illuminated using polarized radiation, for example under a registration tool's alignment microscope, the portions of the dummification pattern comprised of vertical lines appeared dark, while the portions comprised of horizontal lines appeared light, as shown in FIG. 4C.

Figure 5:
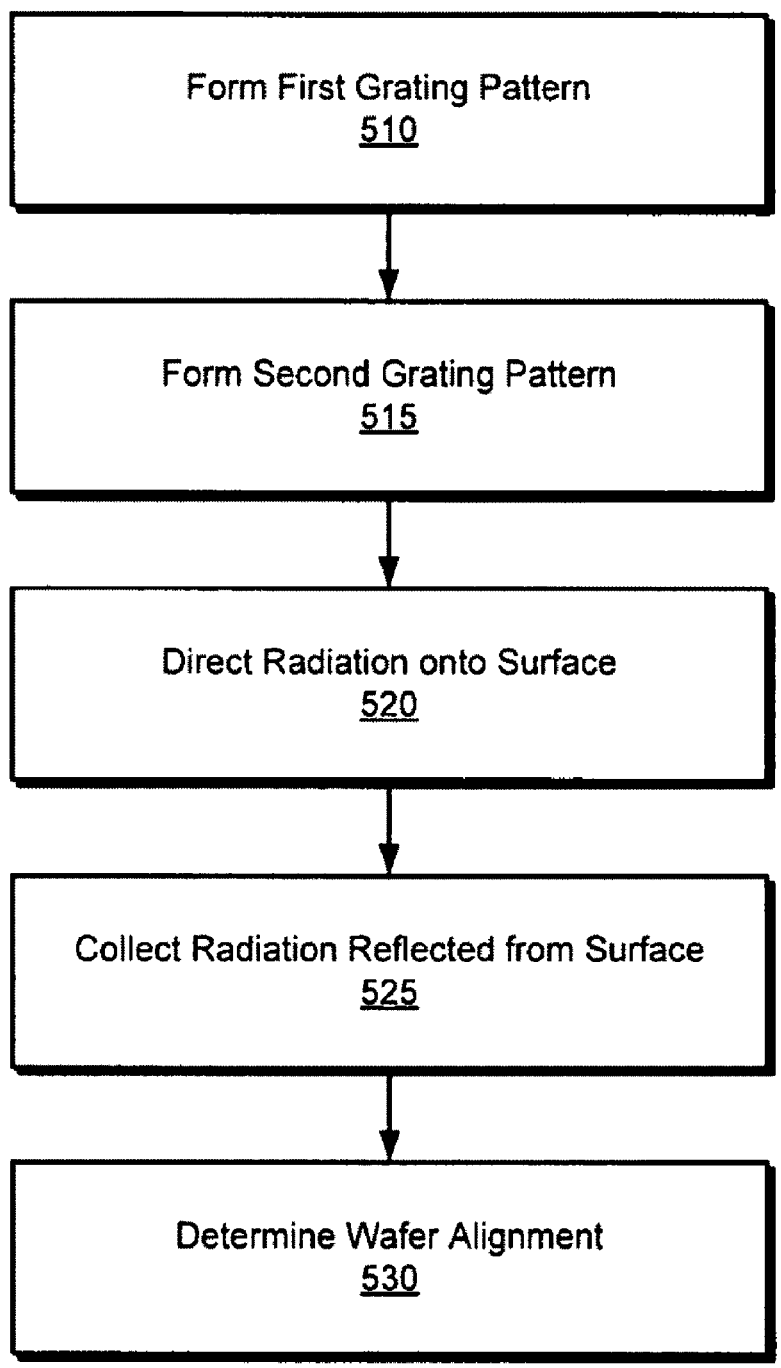
FIG. 5 is a flowchart illustrating a method detecting an alignment of a wafer, according to embodiments.

FIG. 5 is a flowchart illustrating a method detecting an alignment of a wafer, according to embodiments. Referring to FIG. 5, at operations 510, a first grating pattern is formed on the surface of the wafer. For example, the first grating pattern may be formed using a first lithographic etching process. The first grating pattern includes a plurality of gratings oriented in a first direction. At operation 515 a second grating pattern is formed on the surface of the wafer. For example, the second grating pattern may be formed using a second lithographic etching process. The second grating pattern includes a plurality of gratings oriented in a second direction. In some embodiments the first direction and the second direction are substantially orthogonal. In other embodiments, the first direction and the second direction need not be perfectly orthogonal; rather, minor deviations from orthogonal may be implemented. In some embodiments, the first grating pattern has a pitch that is less than the wavelength of the radiation generated by radiation source 132. Similarly, in some embodiments, the second grating pattern has a pitch that is less than the wavelength of the radiation generated by radiation source 132. Additionally, in some embodiments, the first and second grating patterns may be formed in the same lithography process.

At operation 520, radiation is directed onto the surface of the wafer. For example, with reference to FIG. 1, radiation source 132 may generate radiation, and polarizer 134 may polarize radiation from radiation source 132, which may directed onto the surface of wafer 120. At operation 525, radiation reflected from the surface of wafer 120 is collected. For example, radiation may be collected by radiation collector 136. At operation 530, a wafer alignment may be determined using the radiation reflected from the surface which was collected by radiation collector 136. Space for example, analysis system 160 may generate electrical signals corresponding to the intensity of the collected radiation. Because the incident radiation is polarized, radiation reflected from the first grating pattern will exhibit a first intensity level, and radiation reflected from the second grating pattern will exhibit a second intensity level, different from the first intensity level. Therefore, the grating patterns will be visible as different intensity levels of reflected radiation. The border lines between the first region and the second region may be used to demarcate one or more locations on the surface of the wafer. These locations may be compared to data mapping the surface of the wafer in order to determine an alignment of the wafer.

In the description and claims, the terms coupled and connected, along with their derivatives, may be used. In particular embodiments, connected may be used to indicate that two or more elements are in direct physical or electrical contact with each other. Coupled may mean that two or more elements are in direct physical or electrical contact. However, coupled may also mean that two or more elements may not be in direct contact with each other, but yet may still cooperate or interact with each other.

Reference in the specification to "one embodiment" "some embodiments" or "an embodiment" means that a particular feature, structure, or characteristic described in connection with the embodiment is included in at least an implementation. The appearances of the phrase "in one embodiment" in various places in the specification may or may not be all referring to the same embodiment.

Although embodiments have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. A wafer alignment system, comprising:
a radiation source to generate radiation;
a radiation directing assembly to direct at least a portion of the radiation onto a surface of a wafer, the radiation having a polarization state;
an optical analyzer to collect at least a portion of the radiation reflected from the wafer;
the wafer including at least a first region having dummification pattern comprising a first grating pattern oriented in a first direction and at least a second region having a second grating pattern oriented in a second direction, different from the first direction and one or more registration features patterned on top of the dummification pattern, wherein the registration features comprise at least a first component that is parallel to the first direction and a second component that is parallel to the second direction, and wherein the dummification pattern comprises four regions of parallel lines, two of which are oriented in the first direction and two of which are oriented in the second direction, wherein the four regions intersect at a common central point; and the registration pattern comprises sets of lines oriented in the first direction and the second direction and centered about the common central point; and at least one set of lines forms a box centrally disposed about the intersection of the dummification pattern.

2. The system of claim 1, wherein:

the radiation source generates radiation having a wavelength;

the first grating pattern has a pitch that is less than the wavelength;

the second grating pattern has a pitch that is less than the wavelength; and the one or more registration features have a pitch that is greater than the wavelength.

3. The system of claim 1, wherein the radiation directing assembly comprises at least one polarizer to polarize the radiation to a linear polarization state or an elliptical polarization state.

4. The system of claim 1, wherein the first grating pattern and the second grating pattern are formed in the same layer of material of the wafer.

5. The system of claim 1, wherein the first grating pattern and the second grating pattern are formed in different layers of material of the wafer.

6. The system of claim 1, wherein the first direction is substantially perpendicular to the second direction.

7. The system of claim 1, wherein radiation reflected from the first grating pattern has a first polarization orientation and radiation reflected from the second grating pattern has a second polarization orientation.

8. The system of claim 7, wherein the optical analyzer distinguishes between radiation reflected from the first grating pattern and radiation reflected from the second grating pattern.

9. A method to detect an alignment of a wafer, comprising:

forming a dummification pattern comprising a first grating pattern in a region of the wafer during a fabrication process, the first pattern including a plurality of gratings oriented in a first direction and a second grating pattern in a region of the wafer during a fabrication process, the second pattern including a plurality of gratings oriented in a second direction, different from the first direction;

forming one or more registration features patterned on top of the dummification pattern, wherein the registration features comprise at least a first component that is parallel to the first direction and a second component that is parallel to the second direction;

directing radiation onto a surface of a wafer, the radiation having a polarization state;

collecting at least a portion of the radiation reflected from the wafer; and detecting an orientation of the wafer using a characteristic of radiation reflected from the first region and the second region, wherein the dummification pattern comprises four regions of parallel lines, two of which are oriented in the first direction and two of which are oriented in the second direction, wherein the four regions intersect at a common central point;

the registration pattern comprises sets of lines oriented in the first direction and the second direction and centered about the common central point; and at least one set of lines forms a box centrally disposed about the intersection of the dummification pattern.

10. The method of claim 9, wherein:

forming a first grating pattern in a region of the wafer during a fabrication process comprises performing a first lithographic etching process; and forming a second grating pattern in a region of the wafer during a fabrication process comprises performing a second lithographic etching process, different from the first process.

11. The method of claim 9, wherein directing radiation onto a surface of a wafer comprises:

generating radiation having a wavelength; and polarizing the radiation to have an elliptical polarization state or a linear polarization state.

12. The method of claim 11 wherein:

the first grating pattern has a pitch that is less than the wavelength;

the second grating pattern has a pitch that is less than the wavelength; and the one or more registration features have a pitch that is greater than the wavelength.

13. The method of claim 12, wherein radiation reflected from the first grating pattern has a first intensity and radiation reflected from the second grating pattern has a second intensity, the difference in those intensities providing the optical contrast to differentiate the two grating patterns.

14. The method of claim 13, wherein detecting an orientation of the wafer using a characteristic of radiation reflected from the first region and the second region comprises distinguishing between the first intensity and the second intensity.

* * * * *